(12) United States Patent
Mikes (10) Patent No.: US 11,294,416 B1
(45) Date of Patent: Apr. 5, 2022

(54) DIFFERENTIAL CLOCK GENERATOR CIRCUIT

(71) Applicant: Cadence Design Systems, Inc., San Jose, CA (US)

(72) Inventor: Steven Elliott Mikes, Apex, NC (US)

(73) Assignee: CADENCE DESIGN SYSTEMS, INC., San Jose, CA (US)

( * ) Notice: Subject to any disclaimer, the term of this patent is extended or adjusted under 35 U.S.C. 154(b) by 0 days.

(21) Appl. No.: 17/167,707

(22) Filed: Feb. 4, 2021

(51) Int. Cl.
*G06F 1/06* (2006.01)
*H03K 17/687* (2006.01)
*H03K 19/20* (2006.01)

(52) U.S. Cl.
CPC ........... *G06F 1/06* (2013.01); *H03K 17/6872* (2013.01); *H03K 17/6874* (2013.01); *H03K 19/20* (2013.01)

(58) Field of Classification Search
CPC .. G06F 1/06; H03K 17/6872; H03K 17/6874; H03K 19/20
USPC ........................................................ 327/293
See application file for complete search history.

(56) References Cited

U.S. PATENT DOCUMENTS

| 7,633,329 | B2 | 12/2009 | Park | |
|---|---|---|---|---|
| 2008/0265964 | A1* | 10/2008 | Park | H03K 19/018528 327/257 |

OTHER PUBLICATIONS

Park, et al. "PVT-Invariant Single-to-Differential Data Converter with Minimum Skew and Duty-Ratio Distortion" 978-1-4244-1684-4/08/$25.00 © 2008 IEEE.
Shoji, "Elimination of Process-Dependent Clock Skew in CMOS VLSI",IEEE Journal of Solid-State Circuits, vol. SC-21, No. 5, Oct. 1986.

* cited by examiner

*Primary Examiner* — Tomi Skibinski
(74) *Attorney, Agent, or Firm* — Tarolli, Sundheim, Covell & Tummino LLP (57) ABSTRACT

A circuit can include a non-inverter circuit configured to generate a first clock signal with a first logic state during a first period of time in response to an input clock signal having the first logic state, and with a second logic state during a second period of time in response to the input clock signal having the second logic state. The circuit can include an inverter circuit that can be configured to generate a second clock signal with the second logic state during the first period of time in response to the input clock signal having the first logic state, and with the second logic state during the second period of time in response to the input clock signal having the second logic state.

16 Claims, 4 Drawing Sheets

DIFFERENTIAL CLOCK GENERATOR CIRCUIT

TECHNICAL FIELD

The present disclosure relates to a differential clock generator circuit. More particularly, the present disclosure relates to a clock conversion circuit for converting a single-ended clock signal to a differential ended clock signal.

BACKGROUND

A clock generator is an electronic oscillator that produces a clock signal for use in synchronizing a circuit's operation. The signal can range from a simple symmetrical square wave to more complex arrangements. Differential signaling is a method for electrically transmitting information using two complementary signals. The technique sends the same electrical signal as a differential pair of signals, each on a respective conductor to a receiving circuit. The pair of conductors can be wires (typically twisted together) or traces on a circuit board. The receiving circuit responds to the electrical difference between the two signals, rather than the difference between a single wire and ground.

SUMMARY

The present disclosure relates to a differential clock generator circuit.

In an example, a circuit can include a non-inverter circuit that can be configured to generate a first clock signal with a first logic state during a first period of time in response to an input clock signal having the first logic state, and with a second logic state during a second period of time in response to the input clock signal having the second logic state. The circuit can further include an inverter circuit that can be configured to generate a second clock signal with the second logic state during the first period of time in response to the input clock signal having the first logic state, and with the second logic state during the second period of time in response to the input clock signal having the second logic state.

In another example, a circuit can include an input terminal. The circuit can further include a non-inverter circuit that can include a first input, a second input, a third input, and an output. The first input of the non-inverter circuit can be coupled to a voltage source, the second input of the non-inverter circuit can be coupled to terminal ground, and the third input of the non-inverter circuit can be coupled to the input terminal. The circuit can further include an inverter circuit that can include a first input, a second, a third input, and an output. The first input of the inverter circuit can be coupled to the voltage source, the second input of the inverter circuit can be coupled to the ground, and the third input of the inverter circuit can be coupled to the input terminal. The circuit can further include a cross-coupling inverter circuit that can include a first input and a second input. The first input of the cross-coupling inverter circuit can be coupled to the output of the non-inverter circuit, and the second input of the cross-coupling inverter circuit can be coupled to the output of the inverter circuit.

In a further example, a system can include a non-inverter circuit that can include a first field-effect transistor (FET) and a second FET. The first FET can be configured to pull up when an input clock signal has a first logic state to produce a first clock signal with a first logic state during a first time period, and the second FET can be configured to pull down when the input clock signal has a second logic state to produce the first clock signal with the second logic state during a second time period. The system can further include an inverter circuit that can include a third FET and a fourth FET. The third FET can be configured to pull up when the input clock signal has the first logic state to produce a second clock signal with the second logic state during the first time period, and the fourth FET can be configured to pull down when the input clock signal has the second logic state to produce the second clock signal with the first logic state during the second time period.

DETAILED DESCRIPTION

The present disclosure relates to a differential clock generator circuit. Differential clock signals are used in circuit applications to provide a differential clock signal. Existing differential clock generator circuits are configured to receive an input clock signal and process the input clock signal through respective paths referred to as top and bottom paths to generate the differential clock signal. A delay time accumulated along each respective path in producing the differential can differ. To compensate for the delay time, the differential clock generator is configured with circuitry to balance the time delay along the respective paths that split off from a single inverter, with another inverter on the bottom path and a pass-gate on the top path. However, due to processing, operating temperature, and/or input voltage variations, a time delay of the other inverter and the pass-gate can differ, as circuitry of these devices can operate differently. Consequently, a duty cycle of each output clock signal of the differential clock signal can be different and/or distorted, and in some instances, cause a circuit receiving the differential clock signal to not operate normally.

In some examples, a differential clock generator circuit can be configured to process the input clock signal to provide the differential clock signal with first and second output clock signals having similar duty cycles and/or free of distortions, thereby enabling a receiving circuit to operate normally. For example, the differential clock generator circuit can include an input stage. The input stage can include a non-inverter circuit and an inverter circuit. A first signal path can be established through the non-inverter circuit and a second signal path can be established through the inverter circuit. Each of the inverter and non-inverter circuits can include a set of FETs. A first FET from each of the inverter and non-inverter circuits can be configured to pull up when the input clock signal has a first logic state (e.g., a logic "1"). A second FET from each of the inverter and non-inverter circuits can be configured to pull down when the input clock signal has a second logic state (e.g., a logic "0"). The first FET of each of the inverter and non-inverter circuits can be a similar FET type different from the second FET of each of the inverter and non-inverter circuits. For example, the first FET can be an n-channel FET and the second FET can be a p-channel FET. Because the differential clock generator circuit uses similar FET types for a respective logic state of the input clock signal in providing the differential clock signal, a time delay of the inverter and non-inverter circuits can be similar. Thus, because both of the first and second paths are using a similar FET type for the respective logic state of the input clock signal, time delay variations with respect to the inverter and non-inverter circuits can be similar, thereby enabling the inverter and non-inverter circuits to operate similarly under different operation conditions. As such, each of the first and second output clock signals of the differential clock signal can have a similar duty cycle and/or be from distortions.

Figure 1:
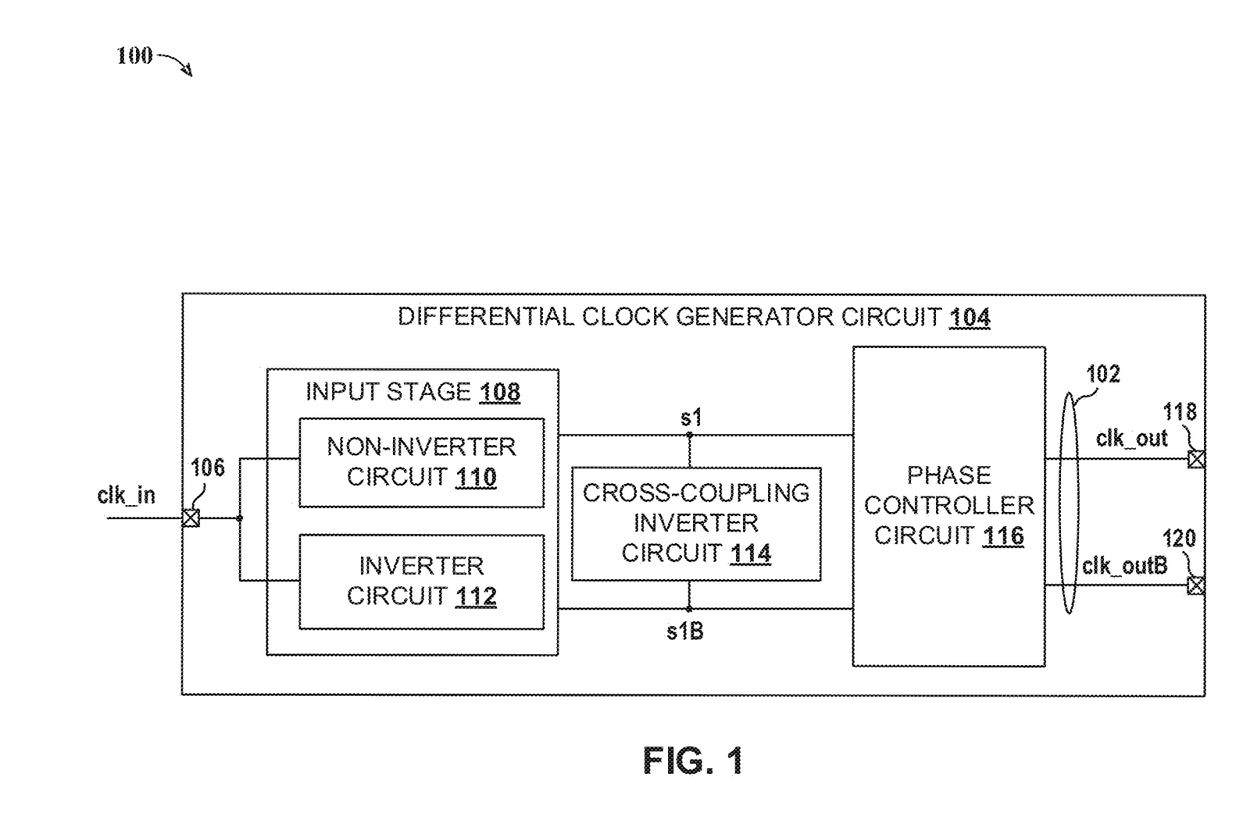
FIG. 1 is an example of a clock generator system.

FIG. 1 is an example of a clock generator system 100. The clock generator system 100 can be used in circuit applications (e.g., high-speed clocking applications) to provide a differential clock signal 102. The clock generator system 100 includes a differential clock generator circuit 104. The differential clock generator circuit 104 can include an input terminal 106. The input terminal 106 can be configured to receive a clock input signal (labeled as "clk_in" in FIG. 1) having a clock input duty cycle.

The differential clock generator circuit 104 can include an input stage 108 that can include a non-inverter circuit 110 and an inverter circuit 112. Respective first inputs of the non-inverter and inverter circuits 110 and 112 can be coupled to the input terminal 106 to receive the clock input signal. The non-inverter circuit 110 can constitute a first signal path through which the clock input signal can be processed to produce a first intermediate clock signal (labeled as "s1" in FIG. 1) at an output of the input stage 108. The inverter circuit 112 can constitute a second signal path through which the clock input signal can be processed to produce a second intermediate clock signal (labeled as "s1B" in FIG. 1) at a second output of the input stage 108. Each of the first and second intermediate clock signals can have an intermediate duty cycle that can be similar to the clock input duty cycle of the clock input signal. In some examples, the differential clock generator circuit 104 can include a cross-coupling inverter circuit 114 to provide the first and second intermediate clock signals at respective first and second outputs of the input stage 110.

In some examples, respective outputs of each of the non-inverter and inverter circuits 110 and 112 can be coupled to respective inputs of the cross-coupling inverter circuit 114. The cross-coupling inverter circuit 114 can be configured to receive the first and second intermediate clock signals. The cross-coupling inverter circuit 114 can be configured to swing an amplitude of the first intermediate clock signal, such that the first intermediate clock signal swings fully in proper time with the second intermediate clock signal. As such, the cross-coupling inverter circuit 114 can drive the amplitude of the first intermediate clock signal, such that the amplitude reaches a peak amplitude (e.g., about 600 millivolts (mV)) in a similar amount of time that an amplitude of the second intermediate clock signal reaches a non-peak amplitude (e.g., about 0 mV) over a period of time.

In some examples, the cross-coupling inverter circuit 114 includes a first inverter and a second inverter. The first and second inverters of the cross-coupling inverter circuit 114 can be sized differently. Thus, transistors for implementing the first inverter can have a different drive strength than transistors for implementing the second inverter. For example, the first inverter can be sized to be N times larger than the second of the cross-coupling inverter circuit 114, wherein N is an even integer value (e.g., two). Thus, the first and second inverters of the cross-coupling inverter circuit 114 can be sized asymmetrically. Because the first inverter is N times large than the second inverter of the cross-coupling inverter circuit 114, the amplitude of the first intermediate clock signal can be driven such that the amplitude reaches the peak amplitude in a similar amount of time that the amplitude of the second intermediate clock signal reaches the non-peak amplitude over the period of time.

In some examples, each of the non-inverter and inverter circuits 110 and 112 can include first and second FETs. The first FET of each of the non-inverter and inverter circuits 110 and 112 can be configured to pull up when the input clock signal has a first logic state (e.g., a logic "1"). For example, the first FET of the non-inverter circuit 110 can be activated to produce the first intermediate clock cycle with a first logic state (e.g., a logic "1") in response to the input clock signal having the first logic state. In some examples, the first FET of the inverter circuit 112 can be activated to produce the second intermediate clock cycle with a first logic state (e.g., a logic "1") in response to the input clock signal having the first logic state.

In further examples, a second FET of each of the inverter and non-inverter circuits 110 and 112 can be configured to pull down when the input clock signal has a second logic state (e.g., a logic "0"). For example, the second FET of the non-inverter circuit 110 can be activated to produce the first intermediate clock cycle with a second logic state (e.g., a logic "0") in response to the input clock signal having the second logic state. In some examples, during the first logic state, the second FET of the inverter circuit 112 can be activated to produce the second intermediate clock cycle with a second logic state (e.g., a logic "0") in response to the input clock signal having the second logic state.

In some examples, the differential clock generator circuit 104 includes a phase controller circuit 116. Respective inputs of the phase controller circuit 116 can be coupled to the cross-coupling inverter circuit 108 to receive one of the first and second intermediate clock signals. The phase controller circuit 116 can be configured control (e.g., adjust) a phase difference between the first and second intermediate clock signals. The phase controller circuit 116 can be configured to produce the differential clock signal 102 with a first output signal (labeled as "clk_out" in FIG. 1) and a second output signal (labeled as "clk_outB" in FIG. 1). The phase controller circuit 116 can be configured to adjust one of the first and second intermediate clock signals to adjust a phase spacing in time between the first and second intermediate clock signals. Thus, the phase controller circuit 116 can be configured to cause the first and second intermediate clock signals to be out of phase by a given phase amount (e.g., 180 degrees out of phase) relative to each other. For example, the phase controller circuit 116 can be configured to delay in time the first intermediate clock signal by a given amount of time to shift in time the first intermediate clock signal relative to the second intermediate clock signal to produce the first output signal. In other examples, the phase controller circuit 116 can be configured to delay in time the second intermediate clock signal by the given amount of time to shift in time the second intermediate clock signal relative to the first intermediate clock signal to produce the second output signal. In some examples, the phase controller circuit 116 can be omitted (e.g., based on hardware and/or accuracy requirements) and in these examples, the first and second intermediate clock signals can correspond to the first and second output signals of the differential clock signal 102.

While the example of FIG. 1 shows a single phase controller circuit in other examples, a plurality of phase controller circuits can be employed. Each phase controller circuit of the plurality of phase controller circuits can be configured to adjust the phase difference between the first and second intermediate clock signals. For example, a first phase controller circuit of the plurality of phase controller circuits can be configured to delay in time the first or the second intermediate clock signal by a first amount of time to shift in time the first or the second intermediate clock signal. A second phase controller circuit of the plurality of phase controller circuits can be configured to further delay in time the first or the second intermediate clock signal by a second amount of time to further shift the first or the second intermediate clock signal. Thus, in examples wherein multiple phase controller circuits are used, the phase difference between the first and second intermediate clock signals can be incrementally adjusted (e.g., changed) until the first and second intermediate clock signals are out of phase by the given phase amount, thereby providing the first and second output clock signals of the differential clock signal 102. In some examples, the differential clock generator circuit 104 can include a first output terminal 118 and a second output terminal 120. Respective outputs of the phase controller circuit 116 can be coupled to one of the first and second output terminals 118 and 120 and configured to provide one of the first and second output clock signals of the differential clock signal 102. In some examples, the first and second output terminals 118 and 120 can be coupled to a circuit for receiving the differential clock signal 102.

In some examples, the first and second FETs of the inverter circuit 112 can have a different size than the first and second FETs of the non-inverter circuit 110. For example, the first and second FETs of the inverter circuit 112 can a different conductive channel shape than the first and second FETs of the non-inverter circuit. By way of example, the conductive channel shape of the first and second FETs of the inverter circuit 112 can be a given shape size (e.g., twice the shape) of the first and second FETs of the non-inverter circuit 110.

In some examples, the first FET of each of the non-inverter and inverter circuits 110 and 112 can be a similar FET type, and the second FET of each of the non-inverter and inverter circuits 110 and 112 can be of a similar FET type different from the first FET. For example, the first FET can be an n-channel FET and the second FET can be a p-channel FET. Because the differential clock generator circuit 104 employs similar FET types for a respective logic state of the input clock signal in providing the differential clock signal 102, a time delay of each of the inverter and non-inverter circuits 110 and 112 can be similar. Thus, since both of the first and second paths employ a similar FET type for the respective logic state of the input clock signal, time delay variations with respect to each of the inverter and non-inverter circuits 110 and 112 can be similar. Thus, the inverter and non-inverter circuits 110 and 112 can be enabled to operate similarly under different operation conditions and track consistently across process, temperature, and voltage variations. Accordingly, the differential clock generator circuit 104 can be configured to provide the differential clock signal 102 having the first and second output signals with a similar duty cycle and/or without signal distortions.

Figure 2:
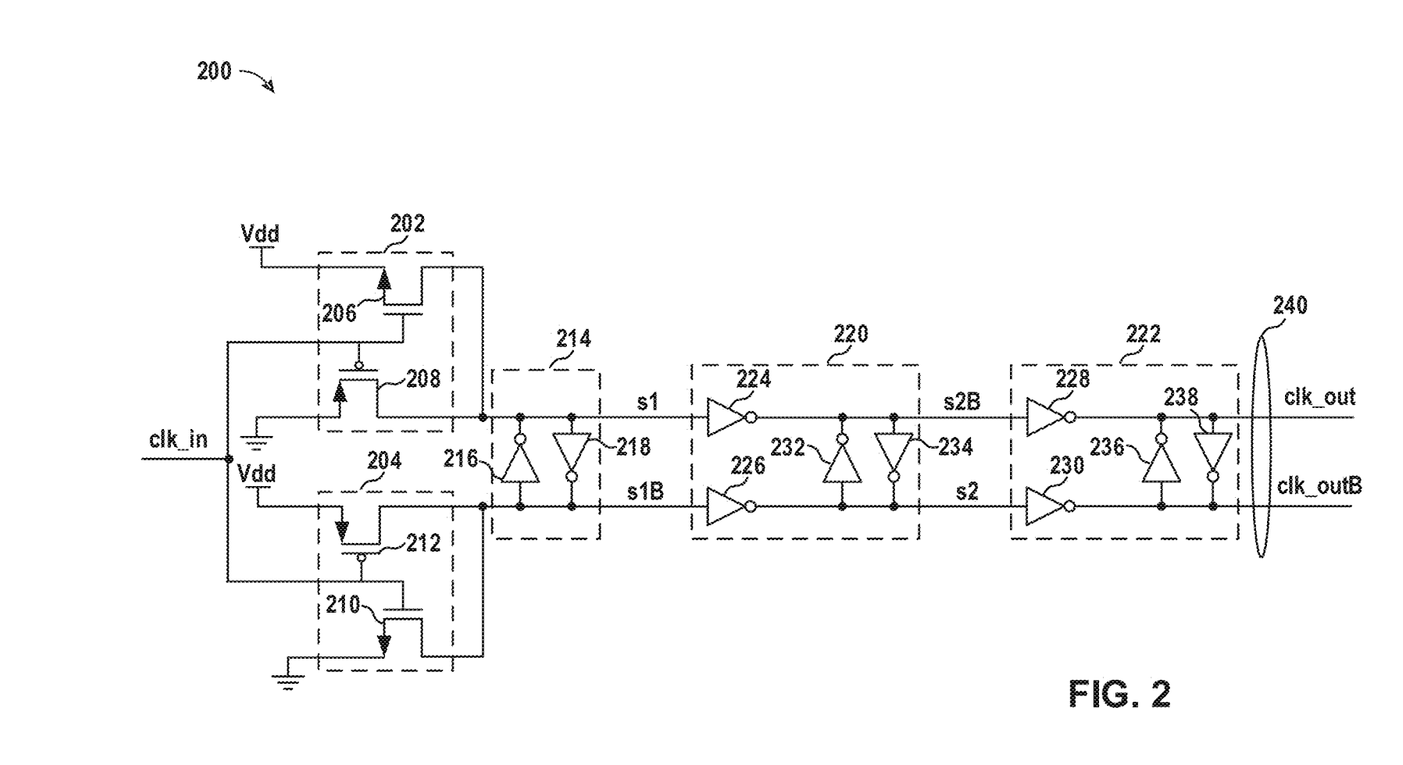
FIG. 2 is an example of a differential clock generator circuit.

FIG. 2 is an example of a differential clock generator circuit 200. The differential clock generator circuit 200 can be similar to the differential clock generator circuit 104, as shown in FIG. 1. Thus, in some examples, references can be made to the example of FIG. 1 in the following description of FIG. 2. The differential clock generator circuit 200 includes a non-inverter circuit 202 and an inverter circuit 204. The non-inverter circuit 202 can be similar to the non-inverter circuit 110 and the inverter circuit 204 can be similar to the inverter circuit 112, as shown in FIG. 1. Each of the non-inverter and inverter circuits 202 and 204 can be configured to receive a clock input signal (labeled as "clk_in" in FIG. 2) having a clock input duty cycle. In some examples, each of the non-inverter and inverter circuits 202 and 204 can be configured to receive an input voltage from a voltage source Vdd, as shown in FIG. 2.

In some examples, the non-inverter circuit 202 includes a first FET 206 and a second FET 208. The inverter circuit 204 can include a third FET 210 and a fourth FET 212. Each of the FETs 206, 208, 210, and 212 has a gate, a source, and a drain. The gates of each of the FETs 206, 208, 210, and 212 can be configured to receive the input clock signal. The source of the first and fourth FETs 206 and FET 212 can be configured to receive the input voltage. The source of the second and third FETs 208 and 210 can be coupled to a ground.

In some examples, during a first period of time, the first and third FETs 206 and 210 can be configured to pull up when the input clock signal has a first logic state (e.g., a logic "1"). For example, during the first period of time, the gate of the first FET 206 can be configured to receive the input clock signal having the first logic state and produce a first intermediate clock signal (labeled as "s1" in FIG. 2) with a first logic state (e.g., a logic "1") at the drain of the first FET 206 based on the input voltage received at the source of the first FET 206. In some examples, during the first period of time, the gate of the third FET 210 can be configured to receive the input clock signal having the first logic state and produce a second intermediate clock signal (labeled as "s1B" in FIG. 2) with a first logic state (e.g., a logic "1") at the drain of the third FET 210 based on the input voltage received at the source of the third FET 210.

In further examples, during a second period of time, the second and fourth FETs 208 and 212 can be configured to pull down when the input clock signal has a second logic state (e.g., a logic "0"). For example, during the second period of time, the gate of the second FET 208 can be configured to receive the input clock signal having the second logic state and produce the intermediate clock signal with a second logic state (e.g., a logic "0") at the drain of the second FET 208. In some examples, during the second period of time, the gate of the fourth FET 212 can be configured to receive the input clock signal having the second logic state and produce the second intermediate clock signal with a second logic state (e.g., a logic "1") at the drain of the fourth FET 212. Each of the first and second intermediate clock signals can have an intermediate duty cycle that can be similar to the clock input duty cycle of the clock input signal.

In some examples, the differential clock generator circuit 200 can include a cross-coupling inverter circuit 214. The cross-coupling inverter circuit 214 can be similar to the cross-coupling inverter circuit 114, as shown in FIG. 1. The cross-coupling inverter circuit 214 can include a first inverter 216 and a second inverter 218 that can be connected in parallel with respect to each other. The drains of each of the FETs 206, 208, 210, and 212 can be coupled to first and second inverters 216 and 218. The first and second inverters 216 and 218 can be sized differently. For example, the first inverter 216 can be sized to be N times larger than the second inverter 218, wherein N is an even integer value (e.g., two). Thus, the first and second inverters 216 and 218 can be sized asymmetrically.

The first and second inverters 216 and 218 can be configured to cause an amplitude of the first intermediate clock signal to swing, such that the first intermediate clock signal swings fully in proper time with the second intermediate clock signal. As such, the cross-coupling inverter circuit 214 can be configured to drive the amplitude of the first intermediate clock signal, such that the amplitude reaches a peak amplitude in a similar amount of time that an amplitude of the second intermediate clock signal reaches a non-peak amplitude over a period of time. Thus, the cross-coupling inverter circuit 214 can be configured to swing the amplitude of the first intermediate clock signal, such that the first intermediate clock signal swings fully in proper time with the second intermediate clock signal.

For example, the first inverter 216 can be configured to pull the amplitude of the first intermediate clock signal to an amplitude of the input voltage being provided by the voltage source using FETs 206 and 208. P-channel FETs are normally used to "pull up" a node because a respective intrinsic polarity allows such devices to bring a node up to a voltage rail (e.g., positive voltage rail) of a power supply source. N-channel FETs can be opposite and can be used to pull down a node's voltage to the ground. In some examples, N-channel FETs can pull up to within a threshold voltage of the voltage rail. For example, if the threshold voltage of the FETs 206 and 210 is about 0.2 volts (V) and the input voltage is about 1.0 V, the FETs 206 and 210 could pull up the first intermediate clock signal to about 0.8 V. The first inverter 216 can provide a "strong" pull up to the node, with the FET 212 inside the inverter 204 able to pull the first intermediate clock signal up further (and vice-versa for pulling down).

In some examples, the differential clock generator circuit 200 can include a first phase controller circuit 220 and a second phase controller circuit 222. In some examples, the first and second phase controller circuits 220 and 222 can be respectively similar to the phase controller circuit 116, as shown in FIG. 1. Each of the first and second phase controller circuits 220 and 222 can include input inverters 224, 226, 228, and 230. In some examples, the first phase controller circuit 220 includes a set of inverters 232 and 234, and the second phase controller circuit 222 includes a set of inverters 236, and 238. The first and second phase controller circuits 220 and 222 can be configured control (e.g., adjust) a phase difference between received intermediate clock signals. The second phase controller circuit 222 can be configured to produce a differential clock signal 240 with a first clock output signal (labeled as "clk_out" in FIG. 2) and a second clock output signal (labeled as "clk_outB" in FIG. 2). The differential clock signal 240 can be similar to the differential clock signal 102, as shown in FIG. 1.

In some examples, the first and second phase controller circuits 220 and 222 can be configured to adjust one of the received intermediate clock signals, such that a phase spacing in time between the received intermediate clock signals is adjusted. Thus, the first and second phase controller circuits 220 and 222 can be configured to cause the received intermediate clock signals to be out of phase by a given phase amount (e.g., 180 degrees out of phase) relative to each other. In some examples, the first and second phase controller circuits 220 and 222 can be omitted (e.g., based on hardware and/or accuracy requirements) and in these examples, the first and second intermediate clock signals can correspond to the first and second output signals of the differential clock signal 242.

In some examples, the first phase controller circuit 220 can be configured to invert and delay in time the first intermediate clock signal by a first amount of time to shift in time the first intermediate clock signal relative to the second intermediate clock signal to provide a third intermediate clock signal (labeled as "s2" in FIG. 2). The third intermediate clock signal can have a different phase than the first intermediate clock signal. In some examples, the first phase controller circuit 220 can be configured to invert the second intermediate clock signal to provide a fourth intermediate clock signal (labeled as "s2B" in FIG. 2). The fourth intermediate clock signal can have a similar phase to the second intermediate clock signal. In some examples, respective inputs of the input inverters 224 and 226 can be configured to receive one of the first and second intermediate clock signals. The input inverters 224 and 226 can be configured to operate with the set of inverters 232 and 234 to provide the third and fourth intermediate clock signals.

In some examples, the second phase controller circuit 222 can be configured to invert and further delay in time the third intermediate clock signal by a second amount of time to shift in time the third intermediate clock signal relative to the fourth intermediate clock signal to provide the first clock output signal. The first output clock signal can have a different phase than the third intermediate clock signal. In some examples, the second phase controller circuit 222 can be configured to invert the fourth intermediate clock signal to provide the second clock output signal. The second output clock signal can have a similar phase to the fourth intermediate clock signal. In some examples, respective inputs of the input inverters 228 and 230 can be configured to receive one of the third and fourth intermediate clock signals. The input inverters 228 and 230 can be configured to operate with the set of inverters 236 and 238 to provide the first and second output clock signals.

Thus, the first and second phase controller circuits 220 and 220 can be configured to respectively adjust the phase difference between the first and second intermediate clock signals to provide the first and second clock output signals that are out of phase by the given phase amount (e.g., based the first amount and the second amount of time that respective clock signals have been adjusted as described herein). Accordingly, the first and second clock output signals of the differential clock signal 240 can be complementary clock signals.

In some examples, the first FET 206 and the third FET 210 can be similar FET types, and the second FET 208 and the fourth FET 212 can be of similar FET types. For example, the first and third FETs 206 and 210 can be n-channel FETs, and the second and fourth FETs 208 and 212 can be p-channel FETs. Because the differential clock generator circuit 200 employs similar FET types for a respective logic state of the input clock signal in providing the differential clock signal 240, a time delay of each of the inverter and non-inverter circuits 202 and 204 can be similar. Thus, time delay variations with respect to each of the inverter and non-inverter circuits 202 and 204 can be similar. Thus, the inverter and non-inverter circuits 202 and 204 can be enabled to operate similarly under different operation conditions and track consistently across process, temperature, and voltage variations. Accordingly, the differential clock generator circuit 200 can be configured to provide the differential clock signal 240 having the first and second output signals with a similar duty cycle and/or without signal distortions.

Figure 3:
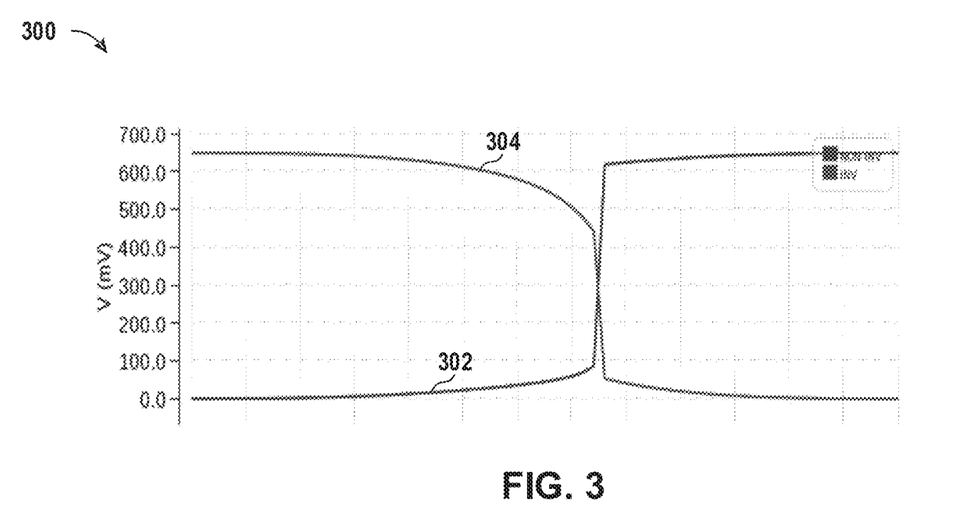
FIG. 3 is an example of a signal diagram associated with an operation of a differential clock generator circuit.

FIG. 3 is an example of a signal diagram 300 associated with an operation of a differential clock generator circuit. In some examples, the differential clock generator circuit is the differential clock generator circuit 104, as shown in FIG. 1, or the differential clock generator circuit 200, as shown in FIG. 2. Thus, in some examples, references can be made to the example of FIG. 1 or 2 in the following description of FIG. 3. By way of example, a y-axis of the signal diagram 300 can represent a voltage (V) in mV and an x-axis of the signal diagram 300 can represent a time (t) in nanoseconds (ns). The signal diagram 300 includes a first response signal 302 and a second response signal 304. In some examples, an input voltage (e.g., generated by the voltage source Vdd, as shown in FIG. 2) signal can be swept to produce the signal diagram 300. Thus, in some examples, the signal diagram 300 can be representative of a DC response of an input stage (e.g., the input stage 110, as shown in FIG. 1) of the differential clock generator circuit. The first response signal 302 can be representative of voltage measurements over time at an output of the non-inverter circuit 114, as shown in FIG. 1 relative to different input voltages. The second response signal 304 can be representative of voltage measurements over time at an output of the inverter circuit 116, as shown in FIG. 1 relative to different input voltages.

Figure 4:
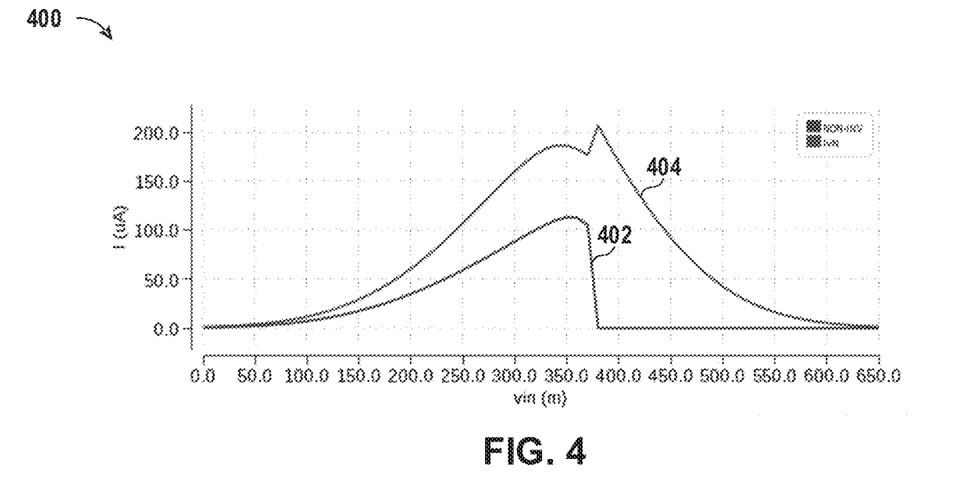
FIG. 4 is an example of another signal diagram associated with an operation of a differential clock generator circuit.

FIG. 4 is an example of another signal diagram 400 associated with an operation of a differential clock generator circuit. In some examples, the differential clock generator circuit is the differential clock generator circuit 102, as shown in FIG. 1, or the differential clock generator circuit 200, as shown in FIG. 2. Thus, in some examples, references can be made to the example of FIG. 1 or 2 in the following description of FIG. 4. By way of example, a y-axis of the signal diagram 400 can represent a current (I) in micro-amps (μA) and an x-axis of the signal diagram 400 can represent a voltage in millivolts (mV). The signal diagram 400 includes a first response signal 402 and a second response signal 404. In some examples, an input voltage (e.g., generated by the voltage source Vdd, as shown in FIG. 2) can be swept to produce the signal diagram 400. Thus, in some examples, the signal diagram 400 can be representative of a DC response of an input stage (e.g., the input stage 112, as shown in FIG. 1) of the differential clock generator circuit. The first response signal 404 can be representative of current measurements over time at an output of the non-inverter circuit 110, as shown in FIG. 1 relative to different voltages. The second response signal 304 can be representative of voltage measurements over time at an output of the inverter circuit 112, as shown in FIG. 1 relative to different input voltages.

Figure 5:
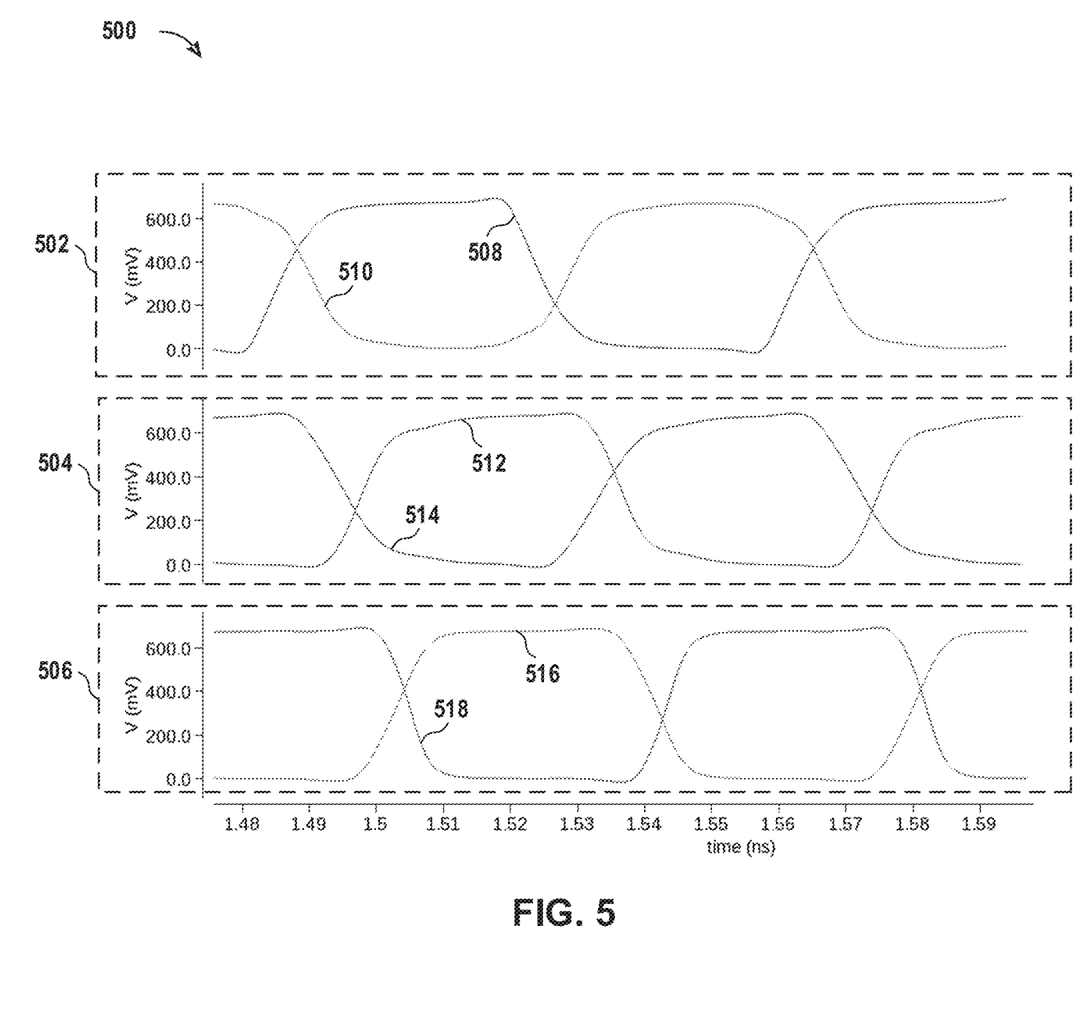
FIG. 5 is an example of a further signal diagram associated with an operation of a differential clock generator circuit.

FIG. 5 is an example of a further signal diagram 500 associated with an operation of a differential clock generator circuit. In some examples, the differential clock generator circuit is the differential clock generator circuit 102, as shown in FIG. 1, or the differential clock generator circuit 200, as shown in FIG. 2. Thus, in some examples, references can be made to the example of FIG. 1 or 2 in the following description of FIG. 5. The signal diagram 500 includes a first signal plot 502, a second signal plot 504, and a third signal plot 506. By way of example, a y-axis of each signal plot 502, 504, and 506 can represent a voltage (V) in mV and an x-axis of the signal diagram 500 can represent a time (t) in ns.

The first signal plot 502 includes a first intermediate clock signal 508 and a second intermediate clock signal 510. The first and second intermediate clock signals 508 and 510 can correspond to the first and second intermediate clock signals s1 and s1B, as shown respectively in FIGS. 1 and 2. The second signal plot 504 includes a third intermediate clock signal 512 and a fourth intermediate clock signal 514. The third and fourth intermediate clock signals 512 and 514 can correspond to the third and fourth intermediate clock signals s2 and s2B, as shown in FIG. 2. The third signal plot 504 includes a first clock output signal 516 and a second clock output signal 518. The first and second clock output signals 516 and 518 can correspond to the first and second clock output signals clk_out and clk_outB, as shown respectively in FIGS. 1 and 2.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. A circuit comprising:
    a non-inverter circuit configured to generate a first clock signal with a first logic state during a first period of time in response to an input clock signal having the first logic state, and with a second logic state during a second period of time in response to the input clock signal having the second logic state;
    an inverter circuit configured to generate a second clock signal with the second logic state during the first period of time in response to the input clock signal having the first logic state, and with the second logic state during the second period of time in response to the input clock signal having the second logic state, the first and second clock signals defining a differential clock signal; and
    a cross-coupling inverter circuit comprising first and second inverters that are sized asymmetrically and configured to cause an amplitude of the first clock signal to reach a first amplitude value in a similar amount of time as an amplitude of the second clock signal reaches a second amplitude value during the first period of time, and cause the amplitude of the first clock signal to reach the second amplitude value in the similar amount of time as the amplitude of the second clock signal reaches the first amplitude value during the second period of time.

2. The circuit of claim 1, wherein the non-inverter circuit comprises a first field-effect transistor (FET) and a second FET, and the inverter circuit comprises a third FET and a fourth FET,
    the first FET being configured to pull up when the input clock signal has the first logic state to produce the first clock signal with the first logic state during the first period of time,
    the third FET being configured to pull up when the input clock signal has the first logic state to produce the second clock signal with the second logic state during the first period of time, the second FET being configured to pull down when the input clock signal has the second logic state to produce the first clock signal with the second logic state during the second period of time, and the fourth FET being configured to pull down when the input clock signal has the second logic state to produce the second clock signal with the first logic state during the second period of time.

3. The circuit of claim 2, wherein the first and third FETs are similar FET types and the second and fourth FETs are similar FET types.

4. The circuit of claim 3, wherein the first and third FETs 206 are n-channel FETs and the second and fourth FETs are p-channel FETs.

5. The circuit of claim 4, wherein the first and second clock signals are first and second intermediate clock signals, the circuit further comprising a phase controller circuit configured to produce a differential clock signal comprising a first clock output signal and a second output signal.

6. The circuit of claim 5, wherein the phase controller circuit is configured to adjust in time the first intermediate clock signal relative to the second intermediate clock signal to adjust a phase spacing between the first and second intermediate clock signals to produce the differential clock signal.

7. The circuit of claim 5, wherein the phase controller circuit is configured to delay in time the first intermediate clock signal by a given amount of time to shift in time the first intermediate clock signal relative to the second intermediate clock signal to provide the second clock output signal of the differential clock signal, the phase controller circuit being configured to provide the second intermediate clock signal as the first output signal of the differential clock signal.

8. The circuit of claim 7, wherein delaying in time the first intermediate clock signal by the given amount of time further comprises inverting the first intermediate clock signal to provide an inverted version of the first intermediate clock signal to provide the second clock output signal, and providing the second intermediate clock signal as the first output signal comprises inverting the second intermediate clock signal to provide the first output signal.

9. A circuit comprising:
an input terminal to receive an input clock signal;
a non-inverter circuit comprising a first input, a second input, a third input, and a first output, the first input of the non-inverter circuit being coupled to a terminal voltage source, the second input of the non-inverter circuit being coupled to terminal ground, and the third input of the non-inverter circuit being coupled to the input terminal, the non-inverter circuit to provide a first clock signal at the first output based on the input clock signal;
an inverter circuit comprising a first input, a second, a third input, and a second output, the first input of the inverter circuit being coupled to the voltage source, the second input of the inverter circuit being coupled to the ground, and the third input of the inverter circuit being coupled to the input terminal, the inverter circuit to provide a second clock signal at the second output based on the input clock signal, the first and second clock signals defining a differential clock signal; and
a cross-coupling inverter circuit comprising a first inverter, a second inverter, a first input, and a second input, the first input of the cross-coupling inverter circuit being coupled to the first output of the non-inverter circuit to couple the non-inverter circuit to the first and second inverters, and the second input of the cross-coupling inverter circuit being coupled to the second output of the inverter circuit to couple the inverter circuit to the first and second inverters, wherein the first and second inverters are sized asymmetrically, and wherein the cross-coupling inverter is configured to cause an amplitude of the first clock signal to reach a first amplitude value in a similar amount of time as an amplitude of the second clock signal reaches a second amplitude value during a first time period, and cause the amplitude of the first clock signal to reach the second amplitude value in the similar amount of time as the amplitude of the second clock signal reaches the first amplitude value during a second time period.

10. The circuit of claim 9,
wherein the non-inverter circuit comprises a first effect transistor (FET), and a second FET, the inverter circuit comprising a third FET and a fourth FET,
wherein respective gates of each of the first, second, third, and fourth FETs are coupled to the input terminal,
wherein respective sources of the first and third FETs are coupled to the voltage source, and
wherein respective sources of the second and fourth FETs are coupled to the ground.

11. The circuit of claim 10, wherein the first and third FETs are similar FET types and the second and fourth FETs are similar FET types.

12. The circuit of claim 11, wherein the first and third FETs 206 are n-channel FETs and the second and fourth FETs are p-channel FETs.

13. The circuit of claim 9, wherein respective drains of the first and second FETs are coupled to the first input of the cross-coupling inverter circuit and respective drains of the third and fourth FETs are coupled to the second input of the cross-coupling inverter circuit.

14. The circuit of claim 13, wherein the cross-coupling inverter circuit comprises a first output and a second output, the circuit further comprising a first output terminal, a second output terminal, and a phase controller circuit comprising a first input, a second input, a first output, and a second output, the first input of the phase controller circuit being coupled to the first output of the cross-coupling inverter circuit, and the second input of the phase controller circuit being coupled to the second output of the cross-coupling inverter circuit, the first output of the phase controller circuit being coupled to the first output terminal, and the second output of the phase controller circuit being coupled to the second output terminal.

15. A system comprising:
a non-inverter circuit comprising a first field-effect transistor (FET) and a second FET, the first FET being configured to pull up when an input clock signal has a first logic state to produce a first clock signal with a first logic state during a first time period, and the second FET being configured to pull down when the input clock signal has a second logic state to produce the first clock signal with the second logic state during a second time period;
an inverter circuit comprises a third FET and a fourth FET, the third FET being configured to pull up when the input clock signal has the first logic state to produce a second clock signal with the second logic state during the first time period, and the fourth FET being configured to pull down when the input clock signal has the second logic state to produce the second clock signal with the first logic state during the second time period, the first and second clock signals defining a differential clock signal; and a cross-coupling inverter circuit comprising first and second inverters that are sized asymmetrically and configured to cause an amplitude of the first clock signal to reach a first amplitude value in a similar amount of time as an amplitude of the second clock signal reaches a second amplitude value during the first time period, and cause the amplitude of the first clock signal to reach the second amplitude value in the similar amount of time as the amplitude of the second clock signal reaches the first amplitude value during the second time period.

16. The system of claim 15, wherein the first and third FETs are similar FET types and the second and fourth FETs are similar FET types.

* * * * *